United States Patent [19]

Chikyou et al.

[11] Patent Number: 5,134,091

[45] Date of Patent: Jul. 28, 1992

[54] QUANTUM EFFECTIVE DEVICE AND PROCESS FOR ITS PRODUCTION

[75] Inventors: Toyohiro Chikyou; Sinya Hashimoto; Satoshi Takahashi; Nobuyuki Koguchi, all of Tsukuba, Japan

[73] Assignee: National Research Institute for Metals, Tokyo, Japan

[21] Appl. No.: 678,434

[22] Filed: Apr. 1, 1991

Related U.S. Application Data

[62] Division of Ser. No. 589,921, Sep. 28, 1990.

[30] Foreign Application Priority Data

Sep. 29, 1989 [JP] Japan .................................. 1-252087

[51] Int. Cl.[5] .......................................... H01L 21/20
[52] U.S. Cl. .................................. 437/107; 437/111; 437/130; 156/DIG. 72; 427/248.1; 427/255.1
[58] Field of Search ................... 148/DIG. 25, 48, 72, 148/154, 169; 156/610–614; 427/248.1, 255.1; 437/81, 105, 107, 108, 111, 126, 130, 132, 133, 936, 973

[56] References Cited

U.S. PATENT DOCUMENTS

| | | | |
|---|---|---|---|
| 4,174,422 | 11/1979 | Mathews | 437/133 |
| 4,831,628 | 5/1989 | Tsang | 156/610 |
| 4,910,167 | 3/1990 | Lee et al. | 437/111 |
| 5,079,186 | 1/1992 | Narusawa | 437/105 |

Primary Examiner—Olik Chaudhuri
Assistant Examiner—Ourmazd S. Ojan
Attorney, Agent, or Firm—Wenderoth, Lind & Ponack

[57] ABSTRACT

A quantum effective device and its method of manufacture are disclosed, wherein said device comprises quantum well boxes composes of a semiconductor substrate and a compound semiconductor on the surface of the semiconductor substrate at least comprising a first and a second elemental component and a semiconductor overlayer overlying said quantum well boxes and the surface portion of the exposed semiconductor substrate and wherein the quantum well boxes have an epitaxially grown single crystal structure obtained by depositing fine droplets of liquid phase composed of the first elemental component on the surface of the semiconductor substrate in the heated state and then incorporating a second elemental component different from the first elemental component in said droplets.

5 Claims, 3 Drawing Sheets

QUANTUM EFFECTIVE DEVICE AND PROCESS FOR ITS PRODUCTION

This is a Rule 60 Divisional of Ser. No. 07/589,921 filed Sep. 28, 1990.

BACKGROUND OF THE INVENTION

1. Field of the Invention

This invention relates to a quantum effective device comprising quantum well boxes, and more specifically, to a quantum effective device comprising quantum well boxes having a microstructure which is useful as a functional material utilizing a quantum size effect.

2. Description of the Prior Art

In recent years, it has been higly expected to develop a new functional material utilizing a quantum size effect. One example of application of such a functional material is a quantum well laser for emitting monochromonized light. The prior level of the technique of forming a microstructure has been unable to realize such expectation.

One of the techniques of producing a new functional material is the technique of quantum well boxes. To realize the quantum well effect in, for example, a GaAs system the size of quantum well boxes must be on the order of 100 Å for realizing the quantum well effect. The method now available to form quantum well boxes is fine working by electron beam lithography (see H. Termkin, G. J. Gossard, M. B. Panish and N. G. Chu Appl. Phys. Lett., 50 48 (1987)). However, it is extremely difficult to perform fine working of the order of 100 Å, and it is said that the limit of fine working by electron beam lithography is about 300 Å. In addition, a serious problem exists with the electron beam lithography in that fine controllability for size distribution of the quantum well boxes is lacking, and that owing to reactive ion etching during fine working, the occurrence of damages cannot be avoided in the crystals in the quantum well boxes existing in the interface between the quantum well boxes and the substrate. If the size of the quantum well boxes are not uniform in size, the quantum well effect will not be produced effectively. Furthermore, if damages should be done to the crystals of the quantum well boxes, some defects would be generated in the quantum well boxes, resulting in the electron trapping at the interfaces between the quantum well boxes and surrounding clad crystals.

Accordingly to form quantum well boxes which produce the quantum size effect, it is necessary to develop quite a new technique of forming quantum well boxes which may supersede the present electron beam lithography.

SUMMARY OF THE INVENTION

It is an object of this invention to provide a quantum effective device which comprises quantum well boxes having a fine and uniform size to such an extent that they produce a quantum size effect.

It is another object of this invention to provide a quantum effective device having no damage in the crystals of quantum well boxes existing in the interface between quantum well boxes and the substrate.

Another object of this invention is to provide a method of production of the above quantum effective devices.

A further object of this invention is to provide a method of producing a new quantum effective device which can overcome the limit of the conventional technique of electron beam lithography.

Another object of this invention is to provide a method of producing a quantum effective device at a low cost, by which ultrafine single crystals can be formed and which does not impart damages to the single crystals of the quantum well boxes.

According to one aspect of this invention, these objects are achieved by a quantum effective device comprising a semi-conductor substrate, quantum well boxes existing on the surface of the semiconductor substrate and comprising a compound semi-conductor containing at least a first and a second elemental components, and a semiconductor overlayer overlying said quantum well boxes and the exposed surface portion of the semiconductor substrate; wherein said quantum well box has an epitaxially grown single crystal structure obtained by forming fine droplets of a liquid phase composed of the first elemental component on the surface of the semiconductor substrate, and then incorporating a second elemental component different from the first elemental component into the droplets.

The combination of semiconductor constituting the semiconductor substrate/the quantum well boxes the semiconductor coverlayer may be composed of components having a relatively small mismatching of lattices, for example with a mismatch of not more than 1%, Example of the combination may be ZnSe/GaAs/AlAs
ZnSe/GaAs/ZnSe
CdTe/InSb/α-Sn
GdTe/InSb/CdTe
InSb/α-Sn/InSb
CdTe/α-Sn/CdTe of the semiconductor materials constituting the quantum well boxes, Ga or In is the first elemental component.

The suitable size of the quantum well boxes which exhibit the quantum effect depends upon the type of the compound semiconductor material. For example, in a GaAs system, it is preferred that the quantum well box has a projecting area of the quantum well box on the substrate of 30 to 100 nm$^2$. In a InSb system, it is preferably 3,000 to 10,000 m$^2$. The variation of the size of the quantum well boxes is preferably such that 95% of the quantum well boxes is within ±10%, more preferably within 5%, of the average value of the projected area on the substrate.

Furthermore, the above objects are achieved, in another aspect, by a method of producing a quantum effective device having a quantum well boxes composed of a compound semiconductor containing at least a first and a second elemental components, which comprises preparing a semiconductor substrate, while the surface of said substrate is heated, depositing thereon a liquid phase composed of the first elemental component, thereafter incorporating the second elemental component in said droplets whereby in the said droplets, single crystals composed of the first and second elemental component are epitaxially grown, and overlying said crystals and the exposed surface of the substrate where the crystals are not deposited with a coverlayer composed of a semiconductor material.

To deposit the fine droplets of a liquid phase composed of the first elemental component a molecular beam containing the first elemental component is preferably irradiated onto the substrate. In order to incorporate the second elemental components into the droplets, a molecular beam containing the second elemental component is desirably irradiated onto the droplets and the substrate. In other words, a method comprising combining liquid phase epitaxy and the molecular beam epitaxy is a desirable method of producing the quantum effective device of this invention, because the liquid phase epitaxy of the microcrystals gives the quantum well boxes little defects, leading to the better quality of quantum well boxes.

Instead of molecular beam epitaxy, it is possible to use metal organic chemical vapor deposition, metal organic molecular beam epitaxy and atomic layer epitaxy.

The coverlayer is desirably formed by irradiating a compound semiconductor molecular beam onto the crystals and the surface of the exposed substrate where the crystals are not deposited.

The surface of the substrate is desirably cleaned in an ultrahigh vacuum.

DETAILED DESCRIPTION OF THE PREFERRED EMBODIMENTS

Now, with reference to the accompanying drawings the quantum effective device of this invention and the method of producing it will be described in detail.

Figure 1:
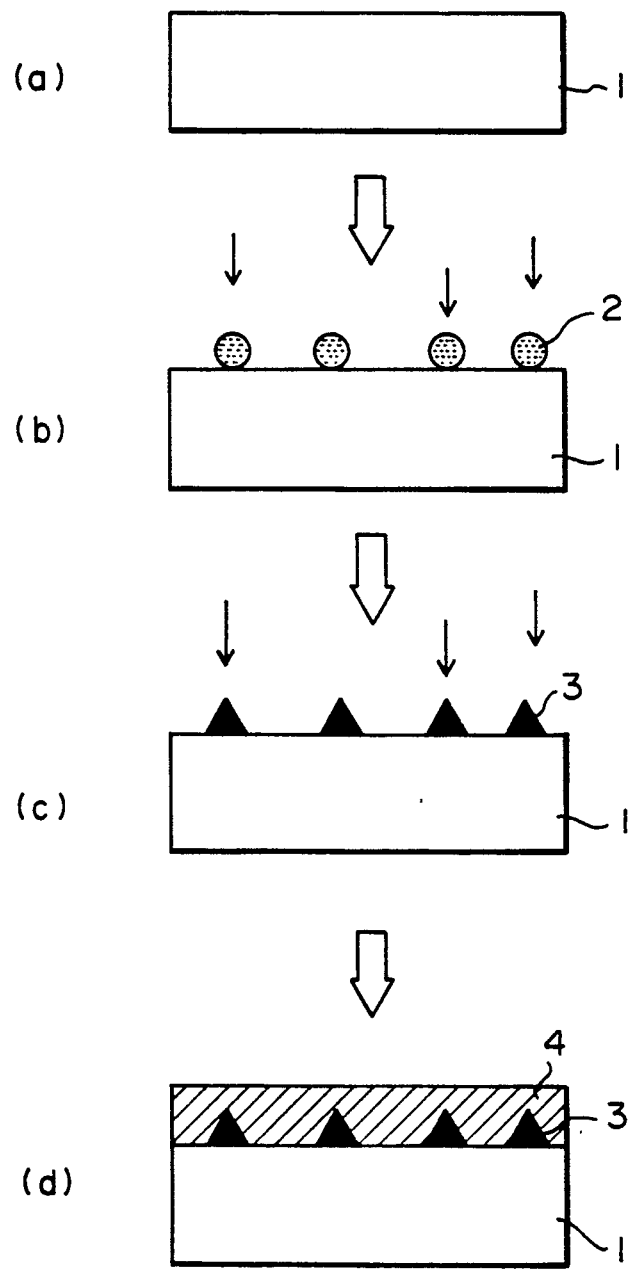
FIG. 1 is a view showing the outline or the production process for making the quantum effective device of this invention.

First, a substrate 1 having a flat surface is prepared to deposit quantum well boxes thereon (see FIG. 1, (a)). The surface of the substrate 1 is composed of a compound semiconductor, and its flat surface can be obtained by polishing the surface of a compound semiconductor to show a low Miller index. The compound semiconductor for quantum well boxes may be selected from a wide range of compound semiconductors. They must exist stably without sublimation or melting at temperatures at which the liquid phase droplets to be described are present on the surface of the substrate. Of course, the compound semiconductor constituting the substrate should not react with the compound semiconductor components constituting the droplets.

The substrate 1 is preferably cleaned by thermal treating it under ultrahigh vacuum, for example, at $10^{-6}$ to $10^{-10}$ torr or more. For example, when ZnSe is used as the substrate 1, it may be heated to about 300° C.

Then, fine droplets 2 of a liquid phase composed of the first elemental component in the compound semiconductor constituting the quantum well boxes are formed on the surface of the substrate (see FIG. 1, (b)). The droplets 2 may be formed by maintaining the surface of the substrate 1 at a temperature which the first elemental component is melted and maintaining the atmosphere under super high vacuum. A molecular beam of the first element is irradiated onto the substrate to form droplets On the surface of the substrate 1 molten droplets distributed in a fine volume, for example, in the form of dots having a size of about 10 nm are formed uniformly. Generally as the temperature of the surface of the substrate becomes higher, the size of the droplets becomes larger, and the number of droplets per unit area of the surface is reduced. The size and distribution of droplets are basically determined by the diffusion length of the first element on the surface. The diffusion length has a close relation to the substrate temperature which is easy to control. Consequently, uniform size of droplets is possible.

The second elemental component which is different from the first elemental component in the compound semiconductor constituting the quantum well boxes is incorporated in the droplets 2 (see FIG. 1, (c)).

By maintaining the surface of the substrate 1 at a temperature at which the first element melts but the second elemental component is not chemisorbed, and holding the atmosphere at ultrahigh vacuum and a molecular beam containing the second elemental component is irradiated onto the surface of the substrate, the second elemental component is not chemisorbed on the substrate, but is incorporated into the droplets of the first element in the liquid phased. As a result, in the fine droplets 2 in the liquid phase, single epitaxial crystals 3 composed of the first elemental component and the second elemental component grow. These epitaxial crystals 3 have a fixed orientation with respect to the orientation of the compound semiconductor constituting the surface of the substrate 1.

Alternatively, the surface of the substrate 1 is maintained at a fixed temperature and maintained in a super-high vacuum, and a molecular beam is irradiated onto the surface of the substrate. When the molecule of second elemental component is irradiated onto the substrate, some molecules are incorporated into droplets of liquid phase, others are remained on the surface of the substrate 1. By this procedure, in the fine droplets 2 in the liquid phase, single epitaxial crystals 3 composed of the first and second elemental components grow. When after the formation of the single crystals 3, the substrate 1 is post-annealed, the second elemental component deposited on the surface of the substrate 1 is desorbed, and only the single crystals 3 exist on the surface of the substrate.

Then, a molecular beam of a compound semiconductor is irradiated on the epitaxial crystals 3 and the exposed surface of the substrate 1 to epitaxially grow the crystals. The epitaxial layer of compound semiconductor forms a coverlayer for covering the epitaxial crystals 3. The epitaxial crystals 3 is sandwiched by the surface of the substrate 1 and the coverlayer 4, and a quantum well boxes are formed in which electrons are confined.

The size limitations of the quantum well boxes and the size variations which cannot be avoided in the prior art of electron beam lithography greatly affect the energy levels formed in the quantum well boxes and causes a difficulty in exhibiting the expected quantum effect. Furthermore, the defects caused to the crystals of the quantum well boxes in the interface between the surface of the substrate and the quantum well boxes, which cannot be avoided in the prior art of electron beam lithography forms electron traps or energy levels in energy band gaps, and greatly affect the development of the quantum effect adversely. However, in the quantum effective device prepared by the method of this invention, the quantum well boxes have a uniform size, and the crystals of the quantum well boxes existing in the interface between the quantum well boxes and the surface of the substrate have no defects, and the device develops a quantum size effect effectively. For example, when the quantum effective device is applied to a semiconductor laser, the value of the full width at half maximum in the spectrum of the emitted light becomes narrow, and the efficiency for light emission is expected to be improved.

The presence of quantum well boxes in the quantum effective device of this invention can be ascertained by photoluminescence or infrared high resolution far infrared Fourier Transformation spectroscopy using modulated photoconductivity technique method. For example, if the quantum well boxes are composed of a GaAs system, the amount of As to be incorporated in Ga in the liquid phase is limited. When the amounts of As near its limit, As is gradually becomes difficult of incorporating in Ga droplets. As a result, deficiency or deficit of As increases. This deficiency or deficit often results in replacement of elements of group IV such as C, Si, Ge and Sn, and they are observed as acceptors. Accordingly, when the concentrations of elements of group IV observed as acceptors are high, it can be considered that quantum well boxes of single crystals grow from the liquid phase. The energy levels of acceptors and the causes of formation of acceptors can be determined by photoluminescence or infrared conducting method. Alternatively, the presence of quantum well boxes in the quantum effective device can be ascertained by measuring the concentration of an $EL_2$ trap existing at a conduction band of 0.8 eV which is only observed in the crystals grown by metal organic chemical vapor deposition.

EXAMPLE 1

A substrate of ZnSe having a thickness of 400 Å obtained by a vapor phase epitaxy method in a high vacuum was heated at 300° C. for 10 minutes to clean the surface of the substrate. The (111) plane of ZnSe was used as the surface of the substrate.

The temperature of the surface of the substrate was maintained at 300° C., and on the surface of the substrate, Ga was deposited with a molecular beam of $4 \times 10^{14}$ atoms/sec. for 30 seconds to form droplets of Ga with an average diameter of about 20 nm in the liquid phase. Then, while the temperature of the surface of the substrate was maintained at about 300° C., As was irradiated with a molecular beam of $4 \times 10^{15}$ atoms/second onto the surface of the substrate and the droplets for 30 seconds. As was not deposited or chemisorbed on the surface of the substrate, but incorporated in the droplets of the liquid phase. In the droplets, single crystals of GaAs grew epitaxially.

Figure 2:
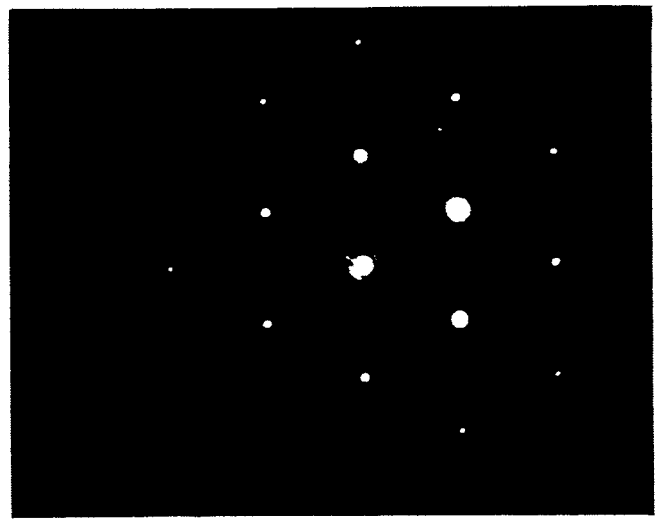
FIG. 2 is an electron diffraction pattern showing that GaAs grows epitaxially on the surface of a ZnSe substrate.
Figure 3:
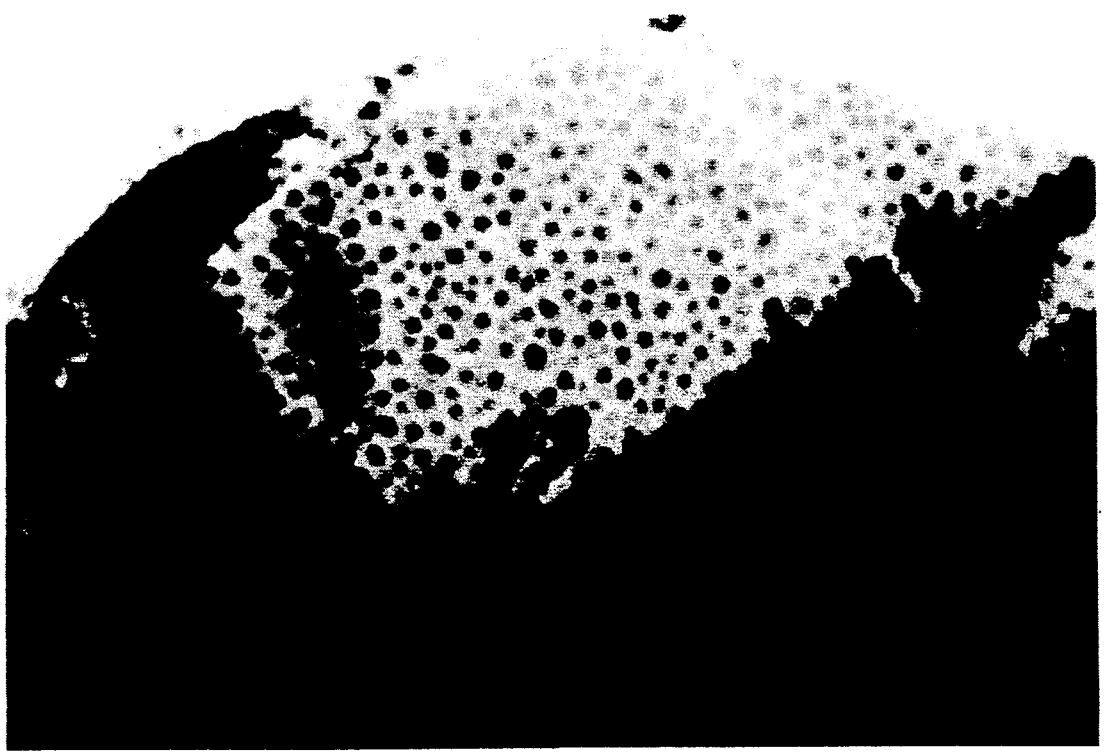
FIG. 3 is an electron micrograph showing the fine single crystal of GaAs on a ZnSe substrate.

The accompanying drawing, FIG. 2, shows that the single crystals of GaAs grew epitaxially on the surface of the substrate composed of ZnSe. FIG. 3 shows the resulting obtained by using transmission electron microscopy. From this figure, a single crystal of GaAs was identified as being grown on the ZnSe substrate. The epitaxially grown GaAs is of a pyramidal shape with a bottom base of about 60 Å.

Then, the temperature of the surface of the substrate was raised to 575° C. Molecular beam of As at the deposition rate of $4 \times 10^{15}$ atoms/sec and molecular beam of Al at the rate of $4 \times 10^{14}$ atoms/sec were deposited on the substrate and the microcrystals of GaAs simultaneously to form an overlayer, leading to the electron confinement in the microcrystals.

During the Ga deposition at first and subsequent As irradiation, the surface temperature of the substrate could be maintained at from 170° to 200° C.

EXAMPLE 2

A substrate composed of CdTe obtained by a vapor phase in an ultrahigh vacuum and having a thickness of 400 Å was heated at 300° C. for 30 minutes to clean the surface of the substrate. The (001) plane of CdTe was used as the surface of the substrate.

Figure 5:
FIGS. 4 and 5, are electron micrographs showing an In droplets on a CdTe substrate.
Figure 4:
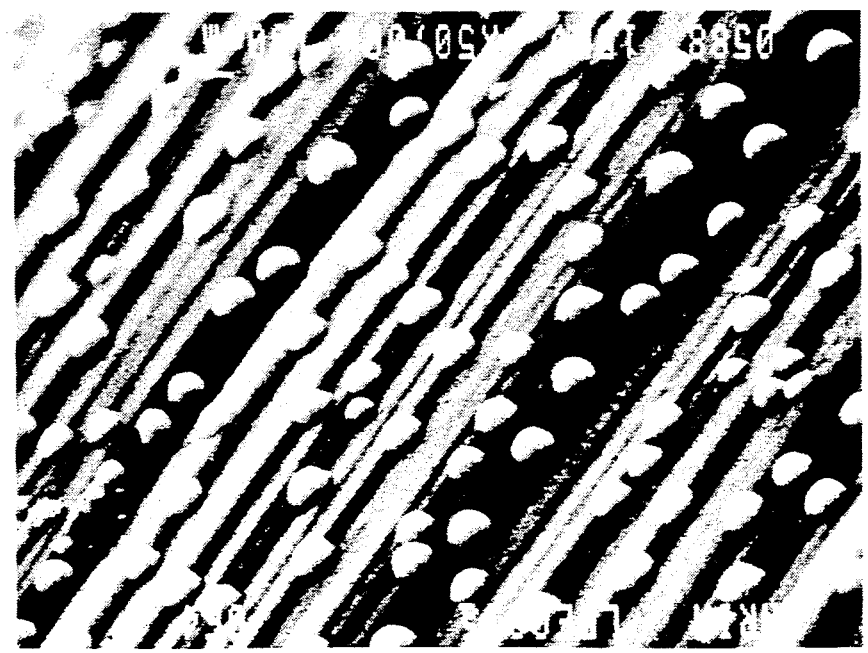

The surface of the substrate as maintained at about 250° C., and on the surface of the substrate, In was deposited for 1 minute at deposition rate of $1.1 \times 10^{14}$ atoms/sec for 1 minute to form droplets in the liquid phase composed of In particles having a size of about 10 nm. FIGS. 4 and 5 are electron micrographs taken by SEM showing In droplets formed on a CdTe substrate. Then while the surface of the substrate was maintained at about 250° C., Sb was irradiated with deposition rate of $1.4 \times 10^{14}$ atoms/sec. to form droplets of In having a particle diameter of about 10 nm on the surface of the substrate and on the droplets for 10 minutes. Sb was not deposited on the surface of the substrate, but incorporated in the droplets in the liquid phase. In the droplets, single crystals of InSb grew epitaxially. InSb which grew epitaxially was of a truncated pyramidal shape with a base of about 1000 Å. The number of single crystals of InSb of truncated pyramidal shape existed at a rate of one per $nm^2$ of the surface of the substrate.

The temperature of the surface of the substrate was raised to 300° C., and Cd and Te were deposited on the surface of the substrate and InSb crystals simultaneously on the surface of the substrate and the InSb crystals to form a coverlayer composed of CdTe having a thickness of about 400 Å. As a result, a quantum effective device could be obtained.

We claim:

1. A method of producing a quantum effective device having quantum well boxes composed of a compound semiconductor containing at least a first and a second elemental component, which comprises
preparing a semiconductor substrate,
depositing fine droplets of a liquid phase composed of the first elemental component on the surface of said substrate in the heated state,
thereafter incorporating the second elemental component in said droplets whereby single crystals comprising the first and second elemental components are epitaxially grown, and
overlying said crystals and the exposed surface of the substrate with a cover layer composed of a semiconductor material and
wherein the said semiconductor substrate is composed of CdTe, the first elemental component is In, the second elemental component is Sb, and the said cover layer is composed of CdTe.

2. The method of claim 1, wherein
a molecular beam containing the first elemental component is irradiated onto said substrate to deposit fine droplets of a liquid phase composed of the first elemental component,
and to incorporate the second elemental component in said droplets, a molecular beam containing the second elemental component is irradiated onto said droplets and the surface of said substrate.

3. The method of claim 1 or 2 wherein said cover layer is formed by irradiating a molecular beam of a compound semiconductor on said crystals and the exposed surface of the substrate.

4. The method of claim 1 or 2 wherein the surface of said substrate is cleaned in an ultrahigh vacuum.

5. The method according to claim 3 wherein the surface of said substrate is cleaned in an ultrahigh vacuum.

* * * * *